United States Patent [19]
Perkins

[11] 4,239,992
[45] Dec. 16, 1980

[54] FREQUENCY TRACKING ADJUSTABLE DUTY CYCLE RATIO PULSE GENERATOR

[75] Inventor: Derrick O. Perkins, Raleigh, N.C.

[73] Assignee: Telex Computer Products, Inc., Tulsa, Okla.

[21] Appl. No.: 942,311

[22] Filed: Sep. 14, 1978

[51] Int. Cl.³ .................. H03K 3/017; H03K 5/04
[52] U.S. Cl. .................. 307/265; 307/273; 328/58
[58] Field of Search ............ 307/265, 266, 267, 273; 328/58

[56] References Cited

U.S. PATENT DOCUMENTS

| | | | |
|---|---|---|---|
| 3,484,624 | 12/1969 | Rasiel et al. | 328/58 |
| 3,725,681 | 4/1973 | Frederiksen | 307/265 |
| 3,867,651 | 2/1975 | Wojslawowicz | 307/265 |
| 3,883,756 | 5/1975 | Dragon | 307/265 |
| 3,921,081 | 11/1975 | Lane | 328/58 |
| 4,057,740 | 11/1977 | Arguello | 307/273 |

*Primary Examiner*—Saxfield Chatmon, Jr.
*Attorney, Agent, or Firm*—Head & Johnson

[57] ABSTRACT

A frequency tracking, adjustable duty cycle ratio pulse generator that accepts an incoming stream of equally time spaced spike pulses, which go to a first input of an OR gate. The output of the OR gate is fed back to a comparator which has a reference voltage on one input terminal, and receives the feedback voltage from the output of the OR gate through a first switch and through a capacitor. There is a shunt circuit around the capacitor that includes a series resistor and a second switch. The output of the capacitor also connects to a second resistor, to ground. In operation, the first switch is closed when the output of the OR gate is high and when the first switch is closed, the second switch is open, and vice versa. The duty cycle ratio is dependent upon the rate of charge of the capacitor, which is controlled by the capacitance and the second resistor. The period of the output pulses is controlled by the discharge of the capacitor through the first resistor, which is determined by the time constant of the capacitance and the first resistance. A second embodiment has an OR gate which serves not only to control the pulsing of the output circuit, but also provides the reference voltage which controls the pulsing.

4 Claims, 5 Drawing Figures

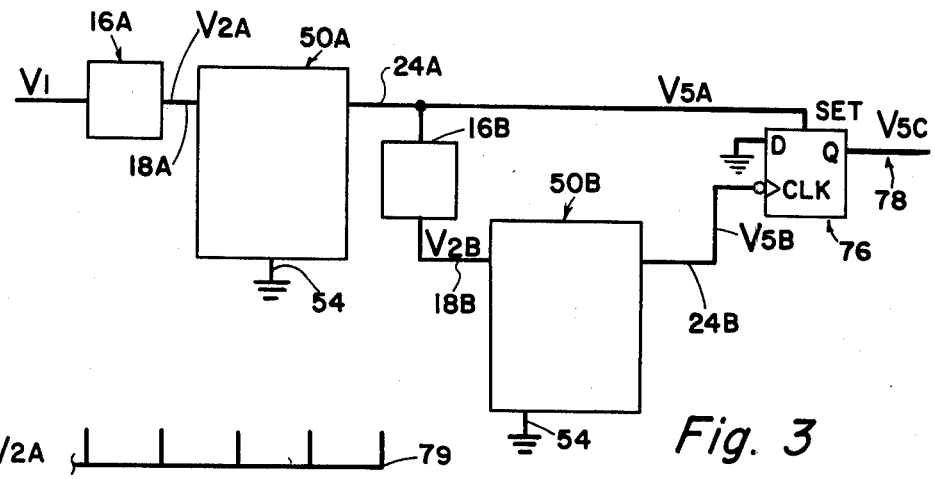
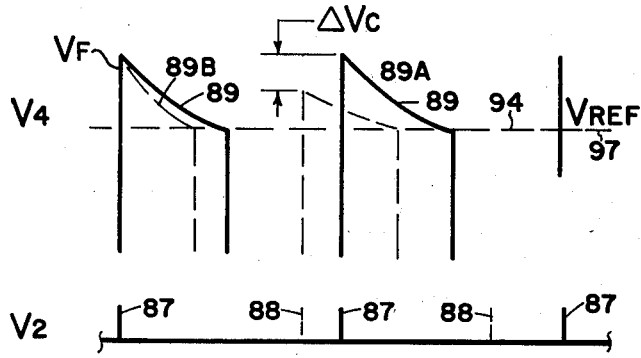
Fig. 4
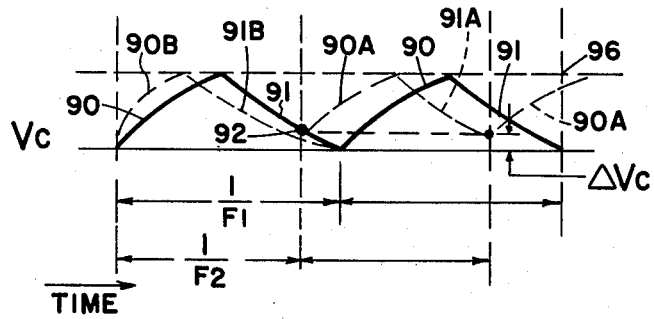
Fig. 5

FREQUENCY TRACKING ADJUSTABLE DUTY CYCLE RATIO PULSE GENERATOR

BACKGROUND OF THE INVENTION

1. Field of the Invention

Often in the development of electronic devices there is a requirement for a pulse generator which can produce a square wave output, having a duty cycle (on/off) ratio which can be varied. It is also often necessary that these constant duty cycle ratio generators be capable of operating over a wide input frequency range.

There are many examples of the need for such a frequency constant duty cycle ratio generator such as, for example, the following:

1. In the horizontal deflection circuit of a cathode ray tube display, it is required that the drive transistor be on for 60% and off 40% of the time of each cycle (i.e., 60/40 duty cycle).

2. In electronic ignition systems for combustion engines, it is necessary to provide control of the width of the trigger pulse to eliminate dwell angle sensitivity. To accomplish this, constant duty cycle pulses must be generated over the full engine rpm (frequency) range.

3. In small disc types of digital data storage systems, separate circuits require that sampling apertures be generated for detection of data bits. It is required that these apertures be adjusted as a function of the data rate (held at a constant duty cycle) in order to optimize data recovery.

There are many other examples of areas in which this type of electronic circuitry is required.

2. Description of the Prior Art

In the prior art, there are a number of examples of circuits which provide constant duty cycle outputs at various frequencies. These can provide a present duty cycle over a range of frequencies or a variable duty cycle for a selected small range of frequencies. However, there has not been any which combine the ability to provide an infinitely adjustable duty cycle ratio and simultaneously to adjust to a wide range of frequencies.

A standard flip-flop circuit can provide a 50% duty cycle output over a wide frequency range. However, the disadvantage of these circuits is that they cannot be used to provide other than 50% duty cycle ratio.

Another type of circuit involves the one-shot devices which provide constant duty cycle ratio outputs of other than 50%. The disadvantages of these circuits it that they can be used only for over very limited frequency ranges.

There are other types that involve counters and so forth; however, those circuits are very complex, and they can only provide selected duty cycles and are not adjustable to infinite variations in duty cycle.

SUMMARY OF THE INVENTION

It is a primary object of this invention to provide a pulse generator that can respond to a wide variation of frequency of input pulses and provide an output train of square wave pulses of a constant duty cycle ratio which may be varied infinitely over the whole range from 0 to 100%.

These and other objects are realized and the limitations of the prior art are overcome in this invention by providing a source of trigger pulses or spikes of selected period. These are connected to one input of an OR gate which outputs a high level voltage when the spike is received. The output of the OR gate feeds back through a first switch and a capacitor to a second input of the gate means, and this voltage then maintains the high output of the OR gate.

The feedback current passing through the capacitor to the OR gate is shunted to ground on its output by a resistor so that current continues to flow through the capacitor, charging the capacitor and developing in increasing voltage across the capacitor, which lowers the feedback voltage on the second input of the OR gate. When this feedback voltage drops below the internal reference voltage of the OR gate, the output of the OR gate drops to a low value. This opens the switch in the feedback line through the capacitor.

A bypass switch and series resistor around the capacitor then discharges the capacitor at a selected rate, until the next spike is received, and the cycle is repeated. By adjusting the value of resistance to ground on the output of the capacitor and the series resistance in the shunt connection around the capacitor, the frequency range and duty cycle ratio can be varied, and made to follow a wide range of periods between the successive spikes of the input pulses.

BRIEF DESCRIPTION OF THE DRAWINGS

These and other objects and advantages of this invention and a better understanding of the principles and details of the invention will be evident from the following description taken in conjunction with the appended drawings in which:

FIG. 3 involves a variation of FIG. 2 to cover the range of duty cycle ratios greater than 50%.

FIG. 4 illustrates the operation of the circuit of FIG. 3.

FIG. 5 illustrates how the circuit adapts to a change of frequency of the input pulses.

DESCRIPTION OF THE PREFERRED EMBODIMENT

Figure 1:
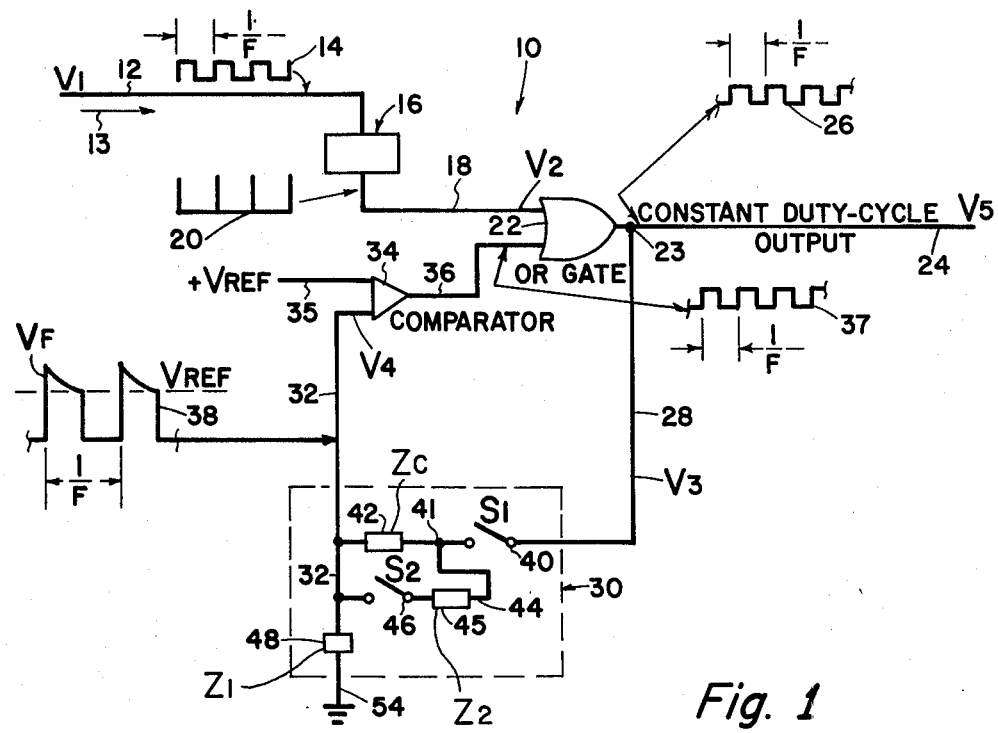
FIG. 1 represents one embodiment of this invention.

Referring now to the drawings and particularly to FIG. 1, there is shown one embodiment of the invention. An input signal of voltage V1 arrives on input lead 12 to the circuit indicated generally by numeral 10. The arrow 13 indicates that it is an input signal to the system. Numeral 14 indicates the wave shape of the signal arriving on line 12 which may be of a square wave of poor wave shape, etc. This first passes through a device 16 well-known in the art which is a wave shaper or differentiator, that can produce a series of spaced spikes or sharp pulses 20 on its output, which is line 18, connected to a first input of the OR gate 22. The voltage 20 is identified by the numeral V2. There is an output line 24 from the OR gate which delivers a constant duty cycle ratio output pulse stream of the wave shape 26 and having the same frequency and period as the input wave 14. The output wave is identified by the voltage V5.

At he junction 23 near the output of the OR gate, a feedback line 28 carries this voltage identified as V3, to a feedback network in the dashed box indicated generally by the numeral 30.

Schematically, the feedback network within the dashed box 30 comprises a first switch S1, numeral 40, in series with a capacitive impedance ZC, numeral 42, which is connected to line 32 which leads to the positive input of a comparator 34. The comparator has on its negative input a reference voltage VREF on line 35. In the feedback circuit 30 is a bypass circuit from 41 through lead 44 through a resistive impedance Z2 numeral 45, through a second switch 46 and to the lead 32 which connects to the comparator. The lead 32 also connects through a resistive impedance Z1 numeral 48, to ground 54.

The switches S1 and S2, numerals 40 and 46, are so controlled that when S1 is closed, S2 is open, and vice versa.

In operation, when a spike of wave shape 20 reaches the OR gate 22, the positive high level voltage on one input creates a high level voltage at the output junction 23. When the voltage V3 is high, switch S1 is closed, thus putting the high voltage V3 through the capacitive impedance 42, through the resistive impedance 48 to ground, and also through lead 32 to the comparator.

The suddenly rising voltage V3 when it is applied to the capacitive impedance provides a high voltage output which latches the OR gate 22 to maintain a high level output signal V3 at 23, as shown by the wave 38, which flows from the feedback network through line 32 to the comparator. As current passes through the capacitive impedance 42 and through the resistive impedance 48 to ground, a voltage VC develops across the impedance 42 as will be explained in FIG. 5, and the voltage in wave 38 will drop with the passage of time in an exponential curve, until it drops to a value of voltage VREF. When it drops below the reference voltage, the signal at V3 drops to a low value, the switch S1 opens, the switch S2 closes, and the charge stored in the capacitive impedance 42 now discharges through the resistive impedance 45 and the switch S2.

Referring briefly to FIG. 5, the first wave shown, V4, is the voltage as applied to the second input of the comparator. At the time of the spike 87 at V2, there is a sudden rise of voltage V4. As the capacitive impedance charges, that voltage drops 89 down to a value of reference voltage 94. When that value of voltage is reached, the voltages V3 and V4 drop to zero. The third wave VC represents the voltage across the capacitive impedance. As it charges up, the voltage increases along the curve 90 until switch S1 is opened, and S2 is closed, and the voltage across the capacitor then drops following the curve 91. On the next spike 87, the cycle is repeated, the voltage increases on curve 90 and then decreases on curve 91. Of course, as the voltage on the capacitor increases, the voltage V4 drops in exactly the opposite magnitude. Therefore, when it reaches the VREF the switching changes and the second half of the duty cycle is carried out.

If a lesser duty cycle ratio is desired, the impedance 48 is reduced, which causes the capacitor 42 to charge at a faster rate, and the shunt resistor 45 is increased to slow down the discharge of the capacitor. Voltage V4 will follow the curve 89B and VC will follow the rising curve 90B and falling curve 91B having a smaller duty cycle ratio than the curves 90 and 91.

Figure 2:
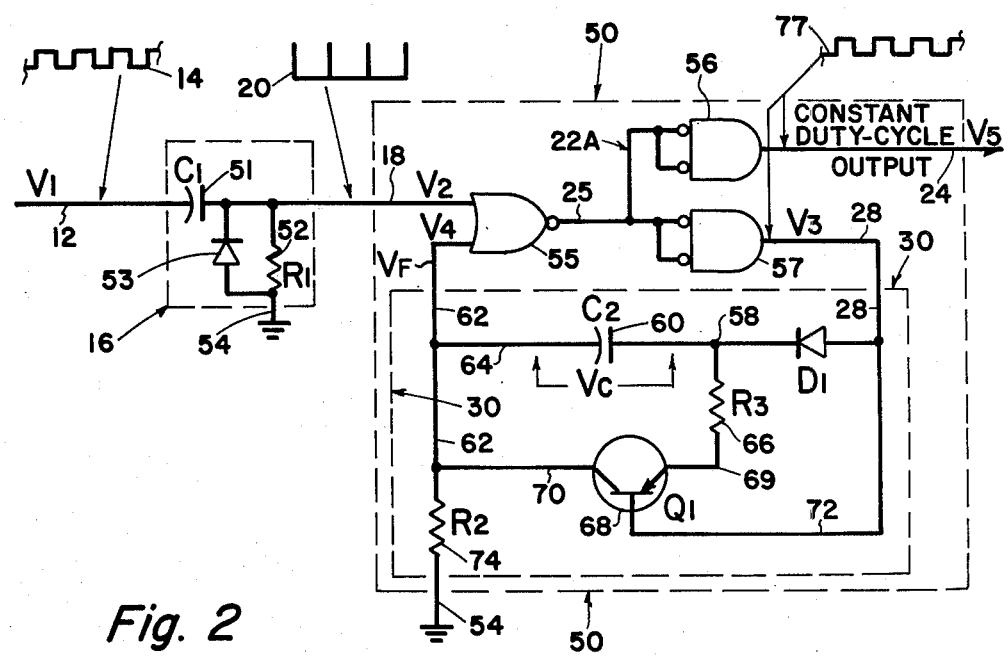
FIG. 2 represents a second embodiment of this invention.

Referring now to FIG. 2, there is shown a second embodiment of the apparatus of FIG. 1. The dashed line indicated generally by the numeral 50 corresponds to the circuit indicated generally by numeral 10 in FIG. 1. An input voltage V1 on line 12 is indicated by the numeral 14. The dashed box 16 is a simple network to provide a positive spike pulse indicated by the numeral 20 by the action of the capacitor 51, resistance 52, and diode 53. This train 20 of spike pulses passes as voltwge V2 on the line 18 to a first input of the NOR gate 55. A pair of NAND gates 56 and 57 are tied to the output of the gate 55. The output of the gate 56 delivers a voltage V5 which is the constant duty cycle ratio output pulse stream indicated by the numeral 77. This output is on line 24. The second NAND gate 57 delivers a voltage V3 which is similar to the wave train 77 which goes by lead 28 to the feedback network indicated generally by the dashed outline 30. This corresponds to the dashed box 30 of FIG. 1.

The switch S1 comprises a diode D1 which is tied to the line 28 and the output of which is connected to junction 58 and to capacitive impedance C2 indicated by numeral 60, the output of which connects to the line 62, which goes to the second input of the NOR gate 55. The capacitive impedance 60 is bypasses by a shunt circuit comprising resistance R3 numeral 66, connected by a line 69 to the emitter of a transistor 68, indicated as Q1, and an output line 70 from the collector of Q1, which connects to the line 62 carrying a voltage train V4. The base of Q1 is tied by line 72 to V3, and Q1 conducts when V3 is low. Line 62 connects to resistor R2 indicated by numeral 74, which connects to ground 54.

In FIG. 2, the NOR gate 55 and the two NAND gates 56 and 57 are indicated generally by the numeral 22A. They correspond to the combination of the OR gate 22 and the comparator 34 of FIG. 1. In other words, the NOR gate 55 combines the action of gate 22 and it also provides a comparator action where the voltage V4 is compared to an internal reference voltage.

Consider the pulse train 14 of FIG. 2 entering the circuit along the input line 12. This is differentiated by the network 16 to form the series of spikes 20, each spike occurring at the instant of the rising voltage of the wave 14. This spike trace 20 travels by line 18 to the NOR gate 55. When a spike occurs, the output voltage on line 25 goes to the inputs of the two NAND gates 56 and 57, and causes the high output voltage on the two lines 24 and 28. The high voltage V3 on line 28 then passes through the diode D1 and through the capacitor 60 back as feedback voltage VF to the second input of the NOR gate 55. This high voltage is higher than the internal reference voltage of the NOR gate, as shown in FIG. 5, and consequently, latches the two NAND gates 56 and 57 to have a high level output voltage representing the start of the positive half of the duty cycle.

Current passing from the diode D1 to the capacitor 60 goes to ground through the resistor 74 and ground 54, and as it does, the capacitor charges up, and builds a voltage VC across the capacitor, which subtracts from the voltage V4 of the line 62. As the capacitor charges, the feedback voltage VF reduces and when it becomes equal to or less than the reference voltage, the output voltages V5 and V3 then drop approximately to zero. When voltage V3 drops to zero, the diode stops passing current, and the voltage VC across the capacitor 60 then discharges through the resistor 66 and transistor Q1. The transistor acts as switch S2 (switch 46) of FIG. 1 and is non-conducting when the voltage V3 is high, but becomes conducting when V3 drops to a low voltage. This permits the discharge of the capacitor 60 at a rate determined by the capacitance of 60 and the resistance of 66.

When the next spike occurs on line 18, the action is repeated and a second square wave is started by the rising voltage V3 and V5. Again, the capacitor charges at a rate determined by the capacitance of 60 and the resistance of 74. The rate of charge of the capacitance determines the length of the positive portion of the cycle, and the discharge rate determined by resistance 66 and the capacitance 60 determines the rate of discharge, or the amount of charge left on the capacitor, by the time the next spike occurs.

Referring briefly to FIG. 5, there is shown three wave shapes labeled V4, V2 and VC. VC represents the voltage across the capacitor 60, the portion 90 being the rise voltage as the capacitor is charged by current flow through the diode, and the portion 91 represents the capacitor voltage as it discharges through the resistor R3 and Q1.

The line V4 represents the voltage applied to the NOR gate. When the voltage VC is low, V4 is high, and as the voltage VC rises along curve 90, the voltage V4 drops on a corresponding curve 89 which is a mirror image of 90. When the voltage V4 reaches the dashed line 94 which represents the reference voltage internal of the NOR gate, the output of the NOR gate on line 25 goes high, and the voltages V5 and V3 go low as previously explained.

Consider that the resistor 74 has been made smaller and therefore, the capacitor 60 will charge more rapidly and will follow the dashed curve 90B. The voltage V4 will fall more rapidly along curve 89A, so that at a shorter time the positive portion of the output pulse train 77 will stop and the voltage will drop to zero, providing a longer period for discharge of the capacitor unitl the next spike voltage 20 arrives. Thus, it is clear that adjustment of the resistor 74 may vary the duty cycle ratio of the output. The duty cycle ratio is also affected by the resistor 66 since it determines how rapidly the capacitor discharges and what charge remains on the capacitor by the time the next input spike pulse is received.

Consider, for example, that the period of the spike pulses 20 is shortened. In FIG. 5, the second pulse 87 now is moved earlier in time to the dashed pulse 88. In other words, the descending portion 91 of the capacitor voltage VC has not decreased to zero but has decreased to a selected voltage 92 when the pulse 88 occurs. Thus, the capacitor VC starts upward from the magnitude 92 and, of course, reaches the magnitude of 96 at which time the voltage V4 drops to the magnitude of the reference voltage 97. And the capacitor again begins to discharge along the line 91A, and by the time the next spike occurs, it is down to the previous voltage 92 and so on.

A rigorous mathematical study of the circuit of FIG. 5 indicates that the ratio of resistance of resistor 74 to the sum of the resistances of 74 plus 66 determines the output to the cycle ratio. The duty cycle can therefore by adjusted over a practical range of approximately zero to 50% by adjusting the value of resistor 74. Duty cycle ratios greater than 50% can be generated by inverting the output signal V5. However, if the input phase coherence must be maintained, that is, the output pulses 77 must line up phase-wise with the input pulses 14, then the duty cycle ratios greater than 50% can be obtained by using two circuits, similar to 50 to generate the desired duty cycle ratio.

This is illustrated in FIG. 3, which shows schematically the box 16A corresponding to the network 16 of FIG. 2; and the box 50A corresponding to the dashed box 50. The inlet line carrying the voltage V1 has the wave shape of 14 and the output on line 24A has the wave shape V5 shown as 77. The voltage V5A goes to one inlet of a presetable delay flip-flop 76. The voltage V5A is taken off to the network 16B which creates a second pulse train derived from the voltage V5A which then controls the network 50B, the output of which on line 24B goes to the clock input of the delay flip-flop 76. The flip-flop output then goes to V5C on line 78. V5A going high sets the output V5C to a high level voltage. V5C will remain high until a down-going transition of V5B is detected by the clock input of flip-flop 76, at which time it goes back to a low level voltage. Flip-flop 76 prevents low level "glitches" at V5C due to delays through 16B and 50B.

This can be explained more clearly by consulting FIG. 4. The first line shows the voltage V2A which enters on line 18A to the network 50A. The voltage V5A is the output on line 24A. The network 16B is similar to 16A except that it is designed to provide a spike on the going down of the wave 80. Thus, voltage V2B, the spikes are coincident with the down-going portion of the voltage V5A and the output of circuit 50B of line 24B is again a square wave pulse of controlled duty cycle ratio represented by numeral 84. 84 has been shown as having a duty cycle of approximately 20%.

The action of the flip-flop 76 is such that when the voltage 80 rises, the output on line 78 follows the rise and duplicates the voltage V5A. If it were not for the second circuit 50B and flip-flop 76 when V5A drops to a low value, the output voltage 86 on line 78 would also drop with voltage 80. However, in the meantime, a second pulse has been started on the line 24B which is represented by the voltage 84 and so the output pulse on line 78 is held positive, or high, for an additional period corresponding to the duty cycle of the second network 50B. Thus, a combination of two networks as in FIG. 3 can provide a duty cycle ratio which varies from zero to 50%, as controlled by the first network 50A and an additional zero to 50% controlled by the second network 50B, providing a capability of duty cycle ratio from approximately zero to approximately 100%.

The time constant determined by resistor 66 and capacitor 60 determines the low frequency limit of the input frequency range and the frequency to duty cycle transfer function, and thus the accuracy of the duty cycle tracking over the total frequency range. The upper frequency limit is set by the closed loop propagation delay, and the width of the trigger pulses 20, the pulse width of the trigger 20 should be significantly less than the width of the output pulse at the highest frequency of interest.

Since the time constant controlled by resistor 74 and capacitor 60 is a fixed value, varying the peak amplitude of V4 also varies in amount of time it takes V4 to decay to the comparator threshold. Thus, the width of the positive output pulse relative to the total input period is controlled as a function of input frequency and output duty cycle deviation. This ability to track output duty cycle deviation allows the circuit to track out parametric effects on the output duty cycle. This provides stable operation over practical ranges of temperature and voltage variations.

In describing FIG. 1, the network 30 was described in general terms of impedances. It should be noted that the feedback elements, such as 60, 66, and 74, need not necessarily be linear passive elements—they can also be non-linear passive elements or a combination of passive and active linear and non-linear elements. Thus, any desired type of duty cycle control as a function of input frequency can be developed by this basic circuit by the use of selected linear and/or non-linear elements in the feedback network 30.

Normal design procedure would be to select a value for R3, numeral 66, typically between 10,000 and 100,000 ohms, and then calculate a value for C2, that is, the capacitor 60 as a function of the desired low frequency limit. This is done with the equation $$C2 = \text{approx.} \frac{2.5}{K1 R3 F\,(F(\text{in})\,\text{min})} \quad F(\text{in}) = \text{input frequency}$$
$$\text{where } K1 = \frac{V3 - VC}{V3 - VC - VREF}$$

The duty cycle ratio can then be established by the following relationship:

$$\% \text{ Duty Cycle} = \frac{R2}{(R2 + K1R3)} \times 100\%$$

where $R2 \leq K1R3$ $$\text{and } K1 = \frac{V3 - VC}{V3 - VC - VREF}$$

While the invention has been described with a certain degree of particularity, it is manifest that many changes may be made in the details of construction and the arrangement of components without departing from the spirit and scope of this disclosure. It is understood that the invention is not limited to the embodiments set forth herein for purposes of exemplification, but is to be limited only by the scope of the attached claim or claims, including the full range of equivalency to which each element thereof is entitled.

What is claimed is:

1. Apparatus for creating a train of square pulses of adjustable period and duty cycle ratio, responsive to a train of trigger pulses of selected period, comprising:
    (a) a source of trigger pulses of selected period;
    (b) at least a two input OR gate means adapted to receive said trigger pulses at a first input, and to output a "high" voltage for the duration of said trigger pulses;
    (c) feedback means from the output of said OR gate means, through a first switch means and a capacitive impedance, to a second input of said OR gate means, said second input also connected to ground through a first resistor R1; and providing a feedback voltage;
    (d) shunt means comprising a second switch means and a second resistor in series across said capacitive impedance;
    whereby so long as said feedback voltage is greater than a selected voltage, the output voltage of said OR gate means will be held high; and when said feedback voltage is less than said selected voltage, said output of said OR gate means will be low, and said first switch means will open and said second switch means will close.

2. The apparatus as in claim 1 in which the output of said gate means produces the desired train of adjustable duty cycle ratio pulses.

3. Apparatus for creating a train of square pulses of adjustable period and wide range duty cycle ratio, responsive to a train of trigger pulses of selected period, comprising;
    (a) a source of first trigger pulses of selected period;
    (b) first OR gate means adapted to receive said first trigger pulses at a first input, and to output a "high" voltage for the duration of said first trigger pulses on a first output line;
    (c) first feedback means from the output of said first OR gate means, through a first switch means and first capacitive impedance, to a second input to said first gate means, said second input also connected to ground through a first resistor; and providing a feedback voltage to said first OR gate means; first shunt means comprising a second switch means and a second resistor in series across said first capacitive impedance;
    (d) means to form second trigger pulses connected at its input to the output of said first OR gate means;
    (e) second OR gate means adapted to receive said second trigger pulses at a first input, and to output a "high" voltage for the duration of said second trigger pulses on a second output line;
    (f) second feedback means from the output of said second OR gate means, through a third switch means and second capacitive impedance, to a second input of said second OR gate means, said second input also connected to ground through a third resistor; and providing a feedback voltage to said second OR gate means; second shunt means comprising a fourth switch means and a fourth resistor in series across said second capacitive impedance; and
    (g) flip-flop means with its set terminal connected to said first output line, the clock input to said second output line, the D terminal connected to ground, and the Q output comprising the output terminal from said apparatus.

4. Apparatus for creating a train of square pulses of adjustable period and duty cycle ratio, responsive to a train of trigger pulses of selected period, comprising;
    (a) a source of trigger pulses of selected period;
    (b) at least a two input OR gate means adapted to receive said trigger pulses at a first input, and to output a "high" voltage for the duration of said trigger pulses;
    (c) feedback means from the output of said OR gate means, through a first switch means and a capacitive impedance, to ground through a first resistor; and providing a feedback voltage;
    (d) said feedback voltage is connected to one input of a comparator means, and a reference voltage connected to the second input of said comparator means, the output of said comparator means connected to said second input of said OR gate means;
    (e) shunt means comprising a second switch means and a second resistor in series across said capacitive impedance; and wherein
    (f) said first switch means comprises a diode means connected between the output of said OR gate means and one end of said capacitive impedance; and
    (g) said second switch means comprises a transistor having its emitter connected through said second resistor to the junction between said diode and said capacitive impedance, its collector connected to the second end of said capacitive impedance, and its base connected to the output of said OR gate means.

* * * * *